US005424487A

United States Patent [19]

Shioda

[11] Patent Number: 5,424,487

[45] Date of Patent: Jun. 13, 1995

[54] SOUND EFFECT-CREATING DEVICE

[75] Inventor: Kazuaki Shioda, Shizuoka, Japan

[73] Assignee: Kabushiki Kaisha Kawai Gakki Seisakusho, Shizuoka, Japan

[21] Appl. No.: 137,989

[22] Filed: Oct. 19, 1993

[30] Foreign Application Priority Data

Oct. 21, 1992 [JP] Japan .................................. 4-307602
Oct. 23, 1992 [JP] Japan .................................. 4-309665

[51] Int. Cl.[6] .......................... H03C 1/00; G10H 1/36
[52] U.S. Cl. .......................................... 84/630; 84/707
[58] Field of Search ............... 368/626, 630, 662, 665, 368/692, 701, 707, 737, 741

[56] References Cited

U.S. PATENT DOCUMENTS 5,092,216 3/1992 Wadhams .............................. 84/602
5,109,419 4/1992 Griesinger ............................ 381/63
5,206,446 4/1993 Matsumoto et al. .................. 84/624
5,225,618 7/1993 Wadhams .............................. 84/602
5,272,274 1/1993 Kimura ................................ 84/658

*Primary Examiner*—Vit W. Miska
*Attorney, Agent, or Firm*—Evenson, McKeown, Edwards & Lenahan

[57] ABSTRACT

A sound effect-creating device for imparting a sound effect to a musical tone produced by performance subjects an analog or digital signal indicative of the musical tone to reverberation processing over a predetermined reverberation time to add reverberations to the musical tone. The predetermined reverberation time is set based on a basic reverberation time determined in a manner dependent on the repetition period of a timing clock of a MIDI signal received from an external electronic musical instrument. Alternatively, the repetition period of a timing clock of a MIDI signal transmitted to an external electronic musical instrument is determined based on a reverberation time parameter used in setting the predetermined reverberation time.

10 Claims, 7 Drawing Sheets

SOUND EFFECT-CREATING DEVICE

BACKGROUND OF THE INVENTION

1. Field of the Invention

This invention relates to a sound effect-creating device used in electronic musical instruments and the like, and more particularly to a sound effect-creating device which is adapted to determine a predetermined reverberation time based on a repetition period of a timing clock of a MIDI signal, or vice versa, in imparting a reverberation effect to a musical tone.

2. Prior Art

In performance of a musical instrument or the singing of a song (hereinafter simply referred to as "the performance"), it is a known technique for making the performance, especially the chamber performance, sound natural, to impart to a musical tone a reverberation effect of increasing thickness and depth of the musical tone and adding reverberations thereto. To make use of this technique, a sound effect-creating device comprising a reverberator is generally used today, i.e., at the age of rapid progress in the art related to electronic musical instruments, thereby imparting the reverberation effect to the performance.

In imparting the reverberation effect to the performance by the use of such a sound effect-creating device, it is a conventional method that an operator of the sound effect-creating device sets a reverberation time to the reverberator based on the operator's sense, while taking into consideration the kind of a sound and the tempo of performance.

However, this method has the following inconveniences: First, it is naturally required to adjust, the reverberation time to the tempo of performance of an electronic musical instrument playing an accompaniment in imparting the reverberation effect to a tune played in the performance. Otherwise, reverberations of a musical tone produced by the reverberation processing of a signal of the musical tone do not agree with the accompaniment, and impedes the performance to the contrary. For example, if reverberation is performed on a lilting tune over a rather long reverberation time, the lilt of the tune played is lost. Therefore, the performance with a high tempo should be subjected to such reverberation processing as will suit the high tempo of the performance. According to the conventional method, however, it is difficult for an unskilled person to adjust the reverberation time to the tempo of performance. Moreover, since the reverberation time is set by the operator separately from or independently of the electronic musical instrument for the accompaniment, it prevents the tempo of the accompaniment of the electronic musical instrument from being correlated with the reverberation processing of the musical tone signal when the reverberation time is set to the reverberator. Furthermore, if the tempo of the performance or the accompaniment is changed during the performance, it is impossible to change setting of the reverberation time, since this will impede progress of the performance.

SUMMARY OF THE INVENTION

It is a first object of the invention to provide a sound effect-creating device which is capable of automatically subjecting a signal indicative of a musical tone to reverberation processing over a reverberation time corresponding to the tempo of an electronic musical instrument connected thereto to thereby impart an excellent reverberation effect to the performance.

It is a second object of the invention to provide a sound effect-creating device which is capable of determining the tempo of performance of an electronic musical instrument connected thereto in a manner corresponding to a reverberation time over which a musical tone is reverberated.

To attain the first object of the invention, according to a first aspect of the invention, there is provided a sound effect-creating device for imparting a sound effect to a musical tone produced by performance, including reverberation means for subjecting an analog or digital signal indicative of the musical tone to reverberation processing over a predetermined reverberation time to thereby impart a reverberation effect to the musical tone.

The sound effect-creating device according to the first aspect of the invention is characterized by comprising:

MIDI signal-receiving means connected to an electronic musical instrument for receiving a MIDI signal therefrom;

clock period-calculating means for calculating a period of a timing clock of the MIDI signal received by the MIDI signal-receiving means; and reverberation time-setting means for setting the predetermined reverberation time based on the period of the timing clock of the MIDI signal calculated by the clock period-calculating means.

According to the sound effect-creating device of the first aspect of the invention, the predetermined reverberation time is determined based on the period of the timing clock of the MIDI signal received from the electronic musical instrument. Therefore, it is possible to impart an excellent reverberation effect to the performance while causing the tempo of performance of the electronic musical instrument to be correlated with the reverberation time over which the musical tone is reverberated.

Preferably, the reverberation time-setting means includes basic reverberation time-calculating means for calculating a basic reverberation time corresponding to a particular note based on the period of the timing clock of the MIDI signal calculated by the clock period-calculating means, and sets the predetermined reverberation time based on the basic reverberation time calculated by the basic reverberation time-calculating means.

Alternatively or in combination, the reverberation time-setting means includes tempo determining means for determining a tempo of performance of the electronic musical instrument based on the period of the timing clock of the MIDI signal calculated by the clock period-calculating means, and the basic reverberation time-setting means sets the basic reverberation time based on the tempo determined by the tempo determining means.

More preferably, the reverberation time-setting means includes meter setting means for setting a parameter indicative of a meter of the musical tone, and sets the predetermined reverberation time based on the basic reverberation time depending on the parameter indicative of the meter of the musical tone.

According to this preferred embodiment of the invention, it is possible to change the reverberation time alone without changing the tempo of the performance of the electronic musical instrument calculated based on the period of the timing clock of the MIDI signal. Therefore, if the meter of performance of the electronic musical instrument is not synchronous with that of the musical tone while the tempo of the former is identical to that of the latter, it is possible to change the reverberation time such that the reverberation processing is performed in a manner correlated not only with the tempo bust also with the meter of the performance of the electronic musical instrument.

To attain the second object of the invention, according to a second aspect of the invention, there is provided a sound effect-creating device for imparting a sound effect to a musical tone produced by performance, including reverberation means for subjecting an analog or digital signal indicative of the musical tone to reverberation processing over a predetermined reverberation time to thereby impart a reverberation effect to the musical tone.

The sound effect-creating device according to the second aspect of the invention is characterized by comprising:

reverberation time parameter-setting means for setting a reverberation time parameter for use in setting the predetermined reverberation time;

MIDI signal-delivering means for delivering a MIDI signal for control of an electronic musical instrument; and timing setting means for setting a period of a timing clock of the MIDI signal based on the reverberation time parameter set by the reverberation time parameter-setting means.

According to the sound effect-creating device of the second aspect of the invention, the period of the timing clock of the MIDI signal transmitted to the electronic musical instrument is determined based on the reverberation time parameter set by the reverberation time parameter-setting means. Therefore, it is possible to cause the tempo of performance of the electronic musical instrument to be correlated with the reverberation time over which the musical tone is reverberated, to thereby impart an excellent reverberation effect to the performance.

Preferably, the reverberation time parameter-setting means includes basic reverberation time-setting means for setting, as the reverberation time parameter, a basic reverberation time corresponding to a particular note for use in setting the predetermined reverberation time, and the timing setting means sets the period of the timing clock of the MIDI signal based on the basic reverberation time set by the basic reverberation time-setting means.

Alternatively, the reverberation time parameter-setting means includes tempo setting means for setting, as the reverberation time parameter, a tempo of performance of the musical tone, the tempo being in a predetermined relationship with a basic reverberation time corresponding to a particular note for use in setting the predetermined reverberation time, and the timing setting means sets the period of the timing clock of the MIDI signal based on the tempo set by the tempo setting means.

More preferably, the sound effect-creating device includes meter-setting means for setting a parameter indicative of a meter of the musical tone, and reverberation time-setting means for setting the predetermined reverberation time based on the basic reverberation time depending on the parameter indicative of the meter of the musical tone.

According to this preferred embodiment of the invention, it is possible to change the reverberation time alone without changing the period of the timing clock of the MIDI signal. Therefore, if the meter of performance of the electronic musical instrument is not synchronous with that of the musical tone while the tempo of the former is identical to that of the latter, it is possible to change the reverberation time over which the musical tone is reverberated such that the reverberation time is correlated with the meter of performance of the electronic musical instrument.

The above and other objects, features, and advantages of the invention will become more apparent from the ensuing detailed description taken in conjunction with the accompanying drawings.

DETAILED DESCRIPTION

The invention will now be described in detail with reference to the drawings showing preferred embodiments thereof.

Figure 1A:
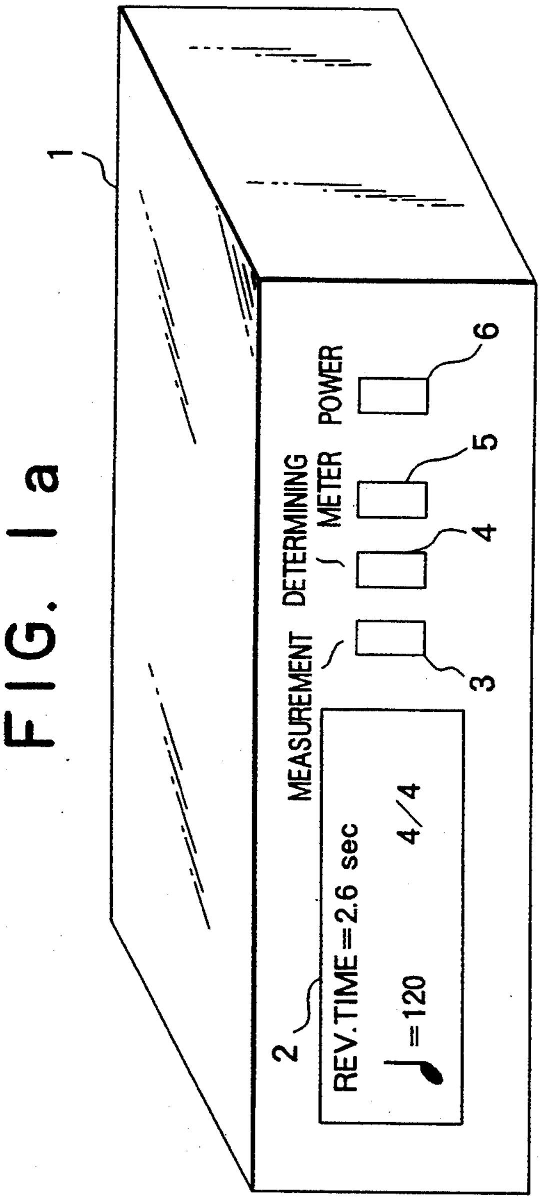
FIG. 1*a* is a diagram showing an appearance (front) of a sound effect-creating device according to a first embodiment of the invention.
Figure 1B:
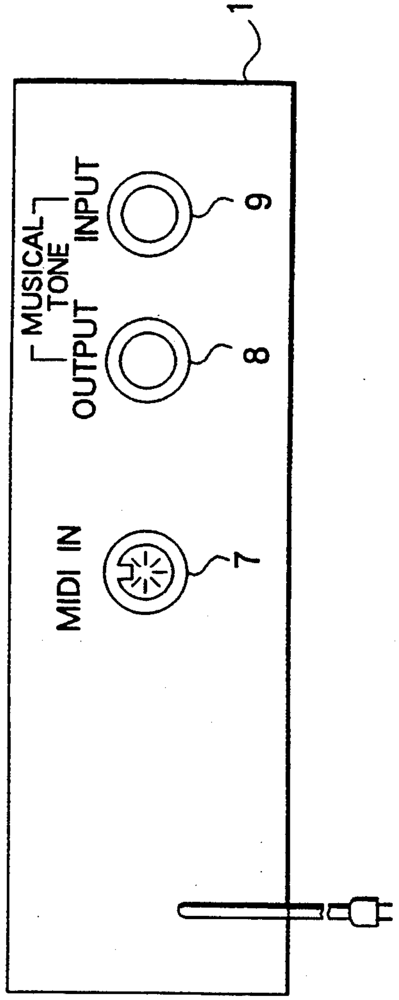
FIG. 1*b* is a diagram showing an appearance (rear) of the sound effect-creating device according to the first embodiment.

First, the construction of a sound effect-creating device according to a first embodiment of the invention will be described with reference to FIG. 1*a*, FIG. 1*b* and FIG. 2. FIG. 1*a* and FIG. 1*b* shows appearances of the sound effect-creating device 1. On the front of the sound effect-creating device shown in FIG. 1*a*, there are arranged a display 2, a measurement switch 3, a determining switch 4, a meter setting switch 5, and a power switch 6. On the rear of same shown in FIG. 1*b*, there are arranged a MIDI signal connector 7, a musical tone output connector 8, and a musical tone input connector 9.

The display 2 is formed of liquid crystal, and displays a basic reverberation time based on which reverberations are added to a musical tone, such as a voice and/or a musical tone produced by an electronic musical instrument and the like, a tempo of performance of an external electronic musical instrument for accompaniment, which is calculated based on a timing clock of a MIDI signal received therefrom, and a meter for changing or setting a reverberation time based on the basic reverberation time.

The measurement switch 3 and the determining switch 4 are both of a push-button type. When the measurement switch 3 is depressed, a basic reverberation time-calculating routine for calculating the basic reverberation time based on the timing clock of the MIDI signal is started. When the determining switch 4 is depressed, a main routine for reverberating the musical tone is started. These routines will be described in detail hereinbelow.

The meter setting switch 5 is operated to input or set a parameter indicative of a meter of the musical tone the signal of which is to be subjected to the reverberating processing, to the sound effect-creating device 1. When the meter setting switch 5 is operated, a meter is displayed on the display 2, and the reverberation time is set based on the basic reverberation time in a manner proportional to the parameter set by the switch 5. Therefore, it is possible to change the reverberation time over which the musical tone is reverberated such that it suits a desired meter without changing the tempo or speed of performance calculated from the timing clock of the MIDI signal. A manner of determining the reverberation time depending on the meter will be described in detail hereinbelow when the basic reverberation time-calculating routine is described with reference to FIG. 5. When the meter setting switch 5 is not operated, no meter is displayed on the display 2, and the reverberation time is set to the basic reverberation time. The power switch 6 is also of a push-button type. When the power switch 6 is depressed, the power starts to be supplied to the sound effect creating device 1.

The MIDI signal connector 7 receives a MIDI signal for timing clock-based synchronous control of electronic musical instruments meeting the MIDI standard requirements, which employ a sequencer or a computer. A signal of the timing clock from the external electronic musical instrument is received via the MIDI signal connector 7.

The musical tone output connector 8 and the musical tone input connector 9 are provided for receiving and outputting the signal indicative of the musical tone, respectively. The musical tone output connector 8 is connected to an audio amplifier, not shown, while the musical tone input connector 9 is connected to a microphone, an electronic musical instrument other than the aforementioned external musical instrument, or the like, neither of which is shown.

Then, referring to FIG. 2, there will be described the whole arrangement of the sound effect-creating device 1 which is common to the first and second embodiments of the invention. As shown in FIG. 2, the sound effect-creating device 1 comprises a CPU 11, an analog-to-digital (A/D) converter 12, a digital-to-analog (D/A) converter 13, a switch interface 14, a display interface 15, a program ROM 16, a RAM 17, a MIDI block 18, a DSP 19, a DSP program ROM 20, a DSP RAM 21, a DSP tone data RAM 22, and a system bus 23.

More specifically, the CPU 11 is formed by a microcomputer, and controls various operations of the sound effect-creating device 1 including a reverberation processing operation, a reverberation time-setting operation, and reception of data of the MIDI signal. The A/D converter 12 converts an analog signal indicative of the musical tone into a digital signal. The D/A converter 13 converts the digital signal into the analog signal. The switch interface 14 delivers ON/OFF signals set by the switches 3, 4, and 5 to the CPU 11. The display interface 15 converts data of the basic reverberation time, etc. read from the CPU 11 into data for display and supplies the resulting data to the display 2.

The program ROM 16 stores programs for operating the CPU 11. The RAM 17 temporarily stores therein data of values of the basic reverberation time and the tempo as results of calculation by the CPU 11, etc. The MIDI block 18 converts serial data of the timing clock of the MIDI signal received from the external electronic musical instrument via the MIDI signal connector 7 into a signal receivable by the CPU 11.

The DSP 19 adds a reverberation signal formed of predetermined repeated tone signals to the digital signal indicative of the musical tone. The DSP program ROM 20 stores programs for operating the DSP 19. The DSP RAM 21 temporarily stores data required in performing the reverberation processing. The DSP tone data RAM 22 temporarily stores data of the digital signal of the musical tone to effect delay of the digital signal, which is required in carrying out the reverberation processing of the digital signal. The DSP tone data RAM 22 is not particularly limited, but it may contain a memory area formed by an address 0000 to an address FFFF, each of which address can store three bytes of data of the digital signal.

Next, a manner of use of the sound effect-creating device 1 will be briefly described. The type of musical tone to be reverberated is not particularly limited, but when the reverberation effect is to be imparted to a song formed of voice, the microphone is connected to the musical tone input connector 9 to thereby input a signal of a musical tone (voice) to the sound effect-creating device 1. The musical tone output connector 8 is connected to the audio amplifier, and an output block thereof is connected to the loudspeaker. Further, the MIDI signal connector 7 is connected to the external electronic musical instrument.

When the MIDI signal is received from the external electronic musical instrument, and the measurement switch 3 is depressed, measurement of a period (repetition period) of the timing clock of the MIDI signal and calculation of the basic reverberation time and the tempo from the measured period are started. During measurement, both the indications of the basic reverberation time and the tempo on the display 2 flicker. When the indicated values of the basic reverberation time and the tempo become stable or constant, the determining switch 4 is depressed, and accordingly the indications of the basic reverberation time and the tempo cease to flicker to be put into fixedly lighted states. At the same time, the signal indicative of the musical tone (voice)

input via the musical tone input connector 9 is subjected to the reverberation processing based on the basic reverberation time indicated on the display 2, and then delivered from the musical tone output connector 8.

The basic reverberation time normally corresponds to a reverberation time corresponding to one quarter note, and depending on conditions of the performance, i.e. depending on the meter of the musical tone, the reverberation time may be set or changed by operating the meter setting switch 5, as will be described hereinafter in a manner corresponding to one to several half note(s), quarter note(s), eighth note(s), sixteenth note(s), etc., to thereby reverberate the musical tone over the reverberation time.

Thus, the signal indicative of the musical tone input to the sound effect-creating device 1 is delivered to the audio amplifier from the musical tone output connector 8 after the signal is subjected to the reverberation processing over the reverberation time set based on the basic reverberation time, and then supplied to the loudspeaker to generate the musical sound, which enables a reverberation effect to be imparted to the song.

In addition, when the tempo of performance of the external electronic musical instrument for accompaniment is changed during the performance, the period of the timing clock of the MIDI signal is simultaneously changed. Therefore, the sound effect-creating device constantly measures the period of the timing clock, and the basic reverberation time and the tempo indicated on the display 2 as well as the reverberation time are changed in a manner corresponding to the period of the timing clock.

Next, the operation of the sound effect-creating device 1 will be described in detail with reference to FIG. 3 to FIG. 5.

Figure 3:
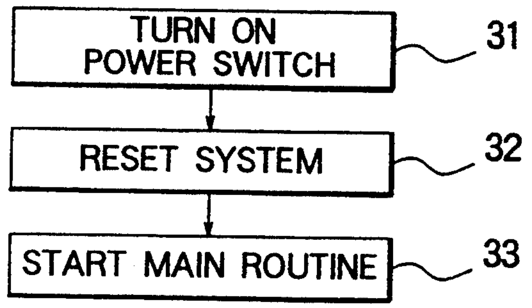
FIG. 3 is a flowchart of a starting routine for starting the sound effect-creating device according to the first and second embodiments.

FIG. 3 shows a starting routine for starting the sound effect-creating device 1. First, when the power switch 6 is turned on, a predetermined power starts to be supplied to the sound effect-creating device 1 at a step 31. The CPU 11 resets the system in a predetermined manner according to a program stored in the program ROM 16 at a step 32, and then starts a main routine or a program shown in FIG. 4 for subjecting the signal of the musical tone to the reverberation processing, at a step 33.

The FIG. 4 main routine is carried out in the following manner:

The CPU 11 constantly monitors an ON/OFF signal supplied via the switch interface 14 from the determining switch 4 at a step 34. When the determining switch 4 is depressed, the CPU 11 stores data of the reverberation time determined based on the basic reverberation time calculated by a basic reverberation time-calculating routine, described hereinafter, into the RAM 17, at a step 35.

Then, the data of the reverberation time is read from the RAM 17 at a step 36. An analog signal of the musical tone is converted into a digital signal by the A/D converter 12, and data or the digital signal (hereinafter referred to as "the data") is delivered via the system bus 23 to the DSP 19 at a step 37. The DSP 19 performs the reverberation processing in the following manner: First, the data is written into the DSP tone data RAM 22. The writing of the data into the DSP tone data RAM 22 is performed in the following manner: First, a data item is written into a write address 0000 of the delay RAM 19. Then, after the lapse of a time period (hereinafter referred to as "the write interval") equal to a sampling period of data sampling performed by the A/D converter 12, the data item stored in the address 0000 is moved into the next address 0001, and then the following data item is written into the address 0000. Such a procedure is repeatedly carried out for all the following items of the data whenever the write interval elapses, whereby the first data item stored is sequentially moved from the address 0000 toward the address FFFF, and all the following data items are stored in a predetermined address area of the DSP tone data RAM 22 having a predetermined sequence of the addresses from 0000 to FFFF at a step 38.

Then, from the data of the reverberation time read out from the RAM 17 at the step 36, the read addresses of the DSP tone data RAM 22 are determined, to read data items from these addresses. The number of the read addresses is not particularly limited, but in the present embodiment, it is set to 10. These read addresses are determined in the following manner: Since a time interval in shifting a data item to the next address having an address number larger by one is equal to the write interval, as described above, an address in which a data item A is stored upon the lapse of the reverberation time after being written into the DSP tone data RAM 22 can be determined if the reverberation time is provided or known. The address numbers of the read addresses are determined by assigning the read addresses at identical intervals between the address 0000 and the thus determined address to which a data item is shifted from the address 0000 over the reverberation time. The reading of the data is performed at a time interval equal to the write interval simultaneously from the ten addresses. If a particular data item (e.g. the data item A) is considered, it is read ten times at intervals of a time period obtained by dividing the reverberation time by 10, over the reverberation time.

The data items read out from these addresses of the DSP tone data RAM 22 are delivered to the DSP 19, where they are multiplied by data items of coefficients corresponding to the respective read addresses, and then all the resulting data items are added up. The data items of the coefficients are provided for setting an attenuation characteristic of reverberation, and are set to achieve progressively-increasing degrees of attenuation in a manner corresponding to a sequence of the read addresses, such that the data read out for the tenth time is attenuated by 60 dB. The data of the coefficients is stored in the DSP program ROM 20 in advance.

Then, the data items added up are delivered to the D/A converter 13 (step 39). This terminates the main routine, and the D/A converter 13 converts the data into the analog signal of the musical tone, which in turn is delivered to the outside of the sound effect-creating device 1.

The basic reverberation time-calculating routine will now be described with reference to FIG. 5. According to this routine, the tempo of performance of the external electronic musical instrument and the basic reverberation time based on which the musical tone is reverberated, are determined from the period of timing clock of the MIDI signal. More specifically, this routine is carried out in the following manner: The CPU 11 constantly monitors the ON/OFF signal supplied from the measurement switch 3 via the switch interface 14 at a step 41. When the measurement switch 3 is depressed, i.e. when the ON signal is detected, the CPU 11 sets T to 0 at a step 42. The symbol T designates a variable for measuring the period of the timing clock of the MIDI signal, which is not particularly limited, and set in the present embodiment such that a value of T=1 corresponds to a time period of 20.8 μsec.

The CPU 11 constantly checks for whether the MIDI signal is supplied thereto via the MIDI block 18 at a step 43. The value of T is increased by an increment of 1 at a step 44 if no MIDI signal is received, and these steps 43 and 44 are repeatedly carried out so long as no MIDI signal is received. If the MIDI signal is received, a value of T assumed then is read at a step 45, and the value of T is multiplied by a unit time period of 20.8 μsec. with the resulting product being set to the period of the timing clock of the MIDI signal. Then, the tempo is calculated at a step 46.

Now, the calculation of the tempo will be described assuming that the value of T is 1000, i.e. the period of the timing clock is equal to 20.8 μsec.×1000 =20.8 msec. More specifically, according to the MIDI standard, the timing clock (F8H) is defined as the system real time message. According to the definition, twenty-four timing clocks are transmitted per one quarter note. The tempo is defined as the number of quarter notes counted per one minute. In the present case, since the period of the timing clock is assumed to be 20.8 msec., the number of timing clocks per one minute is approximately 2880. Therefore, the tempo, which is the number of quarter notes (one quarter note corresponding to 24 timing clocks), can be calculated by dividing the number of timing clocks counted per minute by 24. The thus obtained value of the tempo, i.e. the resulting quotient, is approximately 120.

Then, the basic reverberation time is calculated from the thus obtained value of the tempo at a step 47. A value of the basic reverberation time is obtained by the use of the following equation (1):

$$\text{Basic reverberation time} = 5 - \text{tempo value}/50 \text{ (sec.)} \quad (1)$$

The value of tempo obtained at the step 46 is substituted into the equation (1) to calculate the basic reverberation time. In the above-mentioned example, since the value of the tempo is 120, the basic reverberation time is equal to 2.6 sec.

Data of the tempo and the basic reverberation time calculated as above is stored into the RAM 17 and at the same time converted into data for display, which in turn is supplied via the display interface 15 to the display 2 to be displayed thereon at a step 48, followed by the program returning to the step 42 to repeatedly carry out the basic reverberation time-calculating routine.

In this connection, after the determining switch 4 has been depressed, if the period of the timing clock of the MIDI signal is changed, the basic reverberation time-calculating routine is carried out and then the main routine is automatically executed, to thereby automatically change the basic reverberation time and the tempo as well as indications thereof on the display, and also the reverberation time dependent on the basic reverberation time.

In addition, although, in the present embodiment, the tempo of performance of the external electronic musical instrument is calculated from the period of the timing clock supplied therefrom, and based on a value of the tempo, the basic reverberation time is calculated, this is not limitative, but since the relationship of the period of the timing clock, the tempo, and the basic reverberation time is invariably determined, it goes without saying that the basic reverberation time can be directly calculated from the period of the timing clock.

The basic reverberation time determined by this basic reverberation time-calculating routine corresponds to one quarter note, and when the meter setting switch 5 has not been operated, it is stored as the reverberation time without change, as described hereinabove, into the RAM 17. On the other hand, when the reverberation time is to be determined in a manner suitable for the meter of the musical tone, the reverberation time is determined according to the meter set by the meter setting switch 5 in the following manner: A reference value of 1 is assigned to one quarter note, while reference values of 4, 2, 0.5, and 0.25, are assigned to one whole note, one half note, one eighth note, and one sixteenth note, respectively. The reverberation time is obtained by multiplying the basic reverberation time by the product of selected one of these reference values and the number of beat of the meter, and then stored into the RAM 17. The data of the reverberation time is read at the step 36 of the FIG. 4 main routine, and the read addresses of the DSP tone data RAM 22 are determined as described above, from which data items of the digital signal of the musical tone are read out and multiplied by the data of coefficients. The resulting data items are added up, to complete the reverberation processing of the musical tone signal. For example, when the reverberation processing is performed in a manner corresponding to two quarter notes, so as to suit a two-four meter, reverberations are added to the musical tone over a time period equal to 1×2 times the basic reverberation time. When the reverberation processing is performed in a manner corresponding to three eighth notes, so as to suit a three-eight meter, reverberations are added to the musical tone over a time period equal to 0.5×3=1.5 times the basic reverberation time. In addition, in the case of reverberation based on notes of a kind other than the above-mentioned ones, a reference value of one note of this kind is determined in a manner proportional to duration of one note of this kind.

As described heretofore, according to the present embodiment, the basic reverberation time is calculated based on the period of the timing clock of the MIDI signal, and the reverberation time is determined based on the basic reverberation time thus obtained, and further in a manner proportional to the meter of performance of the instrument, if required. Therefore, the reverberation time can be caused to be correlated not only with the tempo of performance of the electronic musical instrument for accompaniment but also with the meter thereof. Therefore, an excellent reverberation effect can be imparted to the musical tone.

Next, the second embodiment of the invention will be described with reference to FIG. *6a*, FIG. *6b*, FIG. 2 and FIG. 7 to FIG. 10.

This embodiment is distinguished from the first embodiment in that the basic reverberation time is not determined based on the period of the timing clock of the MIDI signal received from the external electronic musical instrument, but conversely, the period of the timing clock of the MIDI signal transmitted to the external electronic instrument is determined based on the basic reverberation time set by the operator. In the following description and related figures, elements and components identical or similar to those of the first embodiment are designated by identical reference numerals, and detailed description thereof is omitted.

Figure 6A:
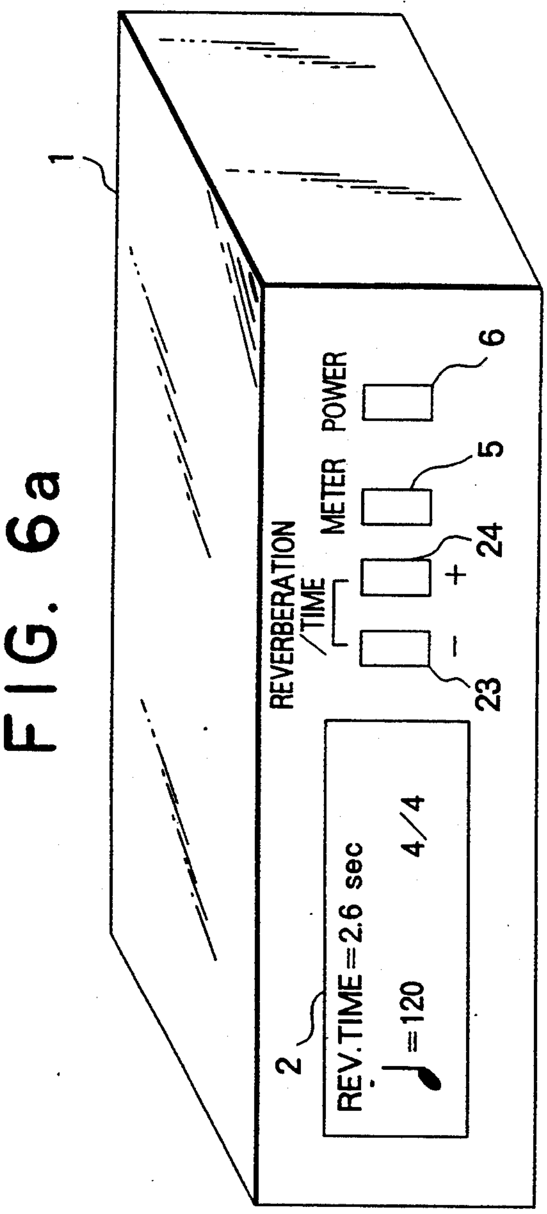
FIG. 6*a* is a diagram showing an appearance (front) of a sound effect-creating device according to the second embodiment.

FIG. 6*a* shows an appearance (front) of the sound effect-creating device according to the second embodiment of the invention. In the figure, reference numerals 23, 24 designate push-button switches for setting the basic reverberation time and the tempo. More specifically, when the switch 23 is depressed, the reverberation time is set to a shorter time period and accordingly a value of the basic reverberation time indicated on the display 2 is decreased. At the same time, a value of the tempo indicated on the display 2 increases as the basic reverberation time decreases. Conversely, when the switch 24 is depressed, the reverberation time is set to a longer time period and accordingly the value of the basic reverberation time indicated on the display 2 is increased, whereas the tempo indicated on the display 2 is set to a smaller value accordingly.

Figure 6B:
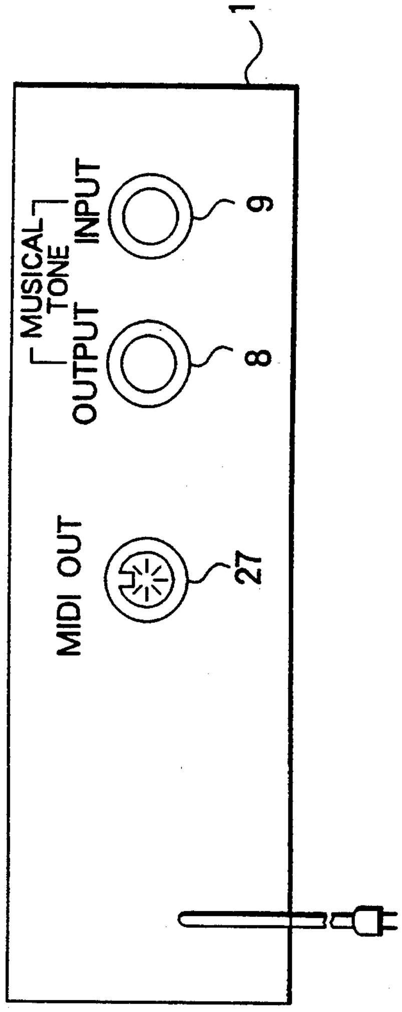
FIG. 6*b* is a diagram showing an appearance (rear) of the sound effect-creating device according to the second embodiment.

FIG. 6*b* shows an appearance (rear) of the sound effect-creating device of the second embodiment. In the figure, the MIDI signal connector 27 is a connector from which is transmitted the MIDI signal to the electronic musical instrument conforming to the MIDI standard in which a sequencer or a computer is used, for synchronous control thereof. A signal of the timing clock is delivered via the MIDI signal connector 27 to the electronic musical instrument.

Figure 2:
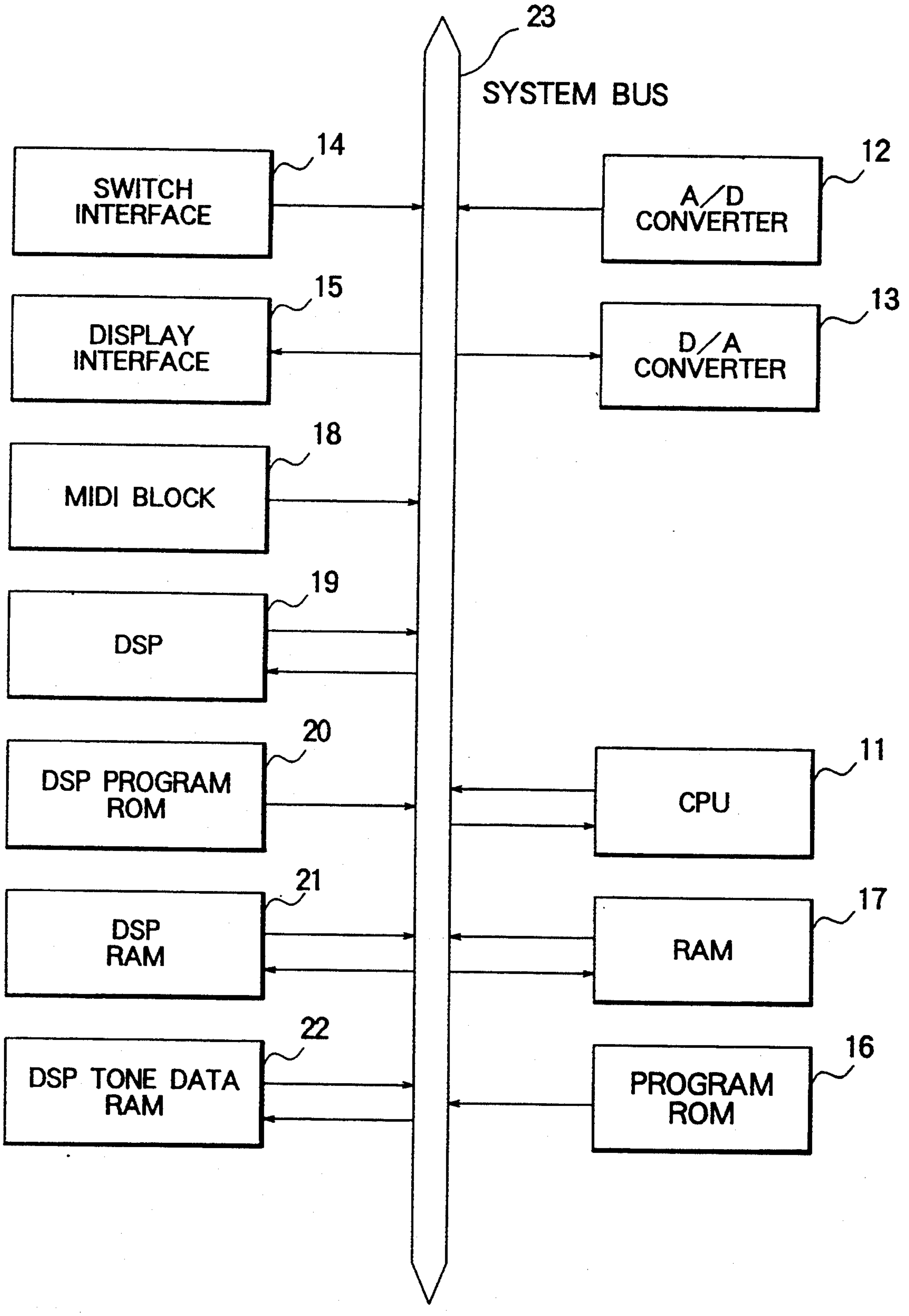
FIG. 2 is a block diagram showing the whole arrangement of the sound effect-creating device which is common to the first embodiment and a second embodiment of the invention.

The arrangement of the sound effect-creating device of the second embodiment is similar to that of the first embodiment shown in FIG. 2. In the present embodiment, the CPU 11 controls various operations of the sound effect-creating device 1 including the reverberation processing of the musical tone signal and preparation of the MIDI signal data. ON/OFF signals generated by the switches 23, 24, and 5 are transmitted via the switch interface 14 to the CPU 11.

The program ROM 16 stores the programs for operating the CPU 11. The RAM 17 temporarily stores results of calculation by the CPU 11, values of the basic reverberation time and the tempo set by the operator, etc. The MIDI block 18 converts the signal of the timing clock delivered from the CPU 11 into a predetermined serial data signal so as to transmit the MIDI signal via the MIDI signal connector 27 to the external electronic musical instrument.

The sound effect-creating device according to the second embodiment is used in the following manner: The device is connected to external devices or systems, similarly to the first embodiment. Then, the basic reverberation time is set as desired by operating the switches 23 and/or 24. Accordingly, the basic reverberation time and the tempo of the performance corresponding thereto are indicated on the display 2.

In this connection, normally, the basic reverberation time corresponds to one quarter note. The reverberation time can be set or changed, if required, by the use of the meter-setting switch 5, depending on the conditions of the performance, i.e. according to the meter of the performance, as described hereinabove with the first embodiment.

By the above settings, the signal indicative of the musical tone input to the sound effect-creating device 1 is delivered from the connector 8 to the audio amplifier, while the reverberation signal is added thereto over the reverberation time, and then supplied to the loudspeaker, which converts the musical tone signal with the reverberation signal into the musical tone having been imparted with the reverberation effect.

Further, the timing clock having a repetition period corresponding to the basic reverberation time set as above is transmitted from the MIDI signal connector 27. Therefore, the electronic musical instrument is played in synchronism with the timing clock supplied thereto, which makes it possible to make the reverberation time for the musical tone and the tempo of performance of the electronic musical instrument for accompaniment to be correlated with each other, and hence to impart an excellent reverberation effect to the performance.

When the basic reverberation time is to be changed, the switch 23 or 24 is depressed to change the basic reverberation time and hence an indication thereof on the display 2, automatically changing the reverberation time over which the musical tone is reverberated as well. In this connection, since the tempo is also set by the switch 23 or 24, it is possible to determine the reverberation time and the tempo of performance of the electronic musical instrument for accompaniment through setting of the tempo. Further, when the meter is set by operating the switch 5, the reverberation time is changed or determined to a value suitable for the meter, which makes it possible to change the reverberation time alone without changing the period of the timing clock of the MIDI signal. In this case, the meter is indicated on the display 2.

Next, the operation of the sound effect-creating device 1 will be described in detail with reference to FIG. 7 to FIG. 10. The device 1 is started according to the starting routine described hereinabove in the first embodiment with reference to FIG. 3.

Figure 7:
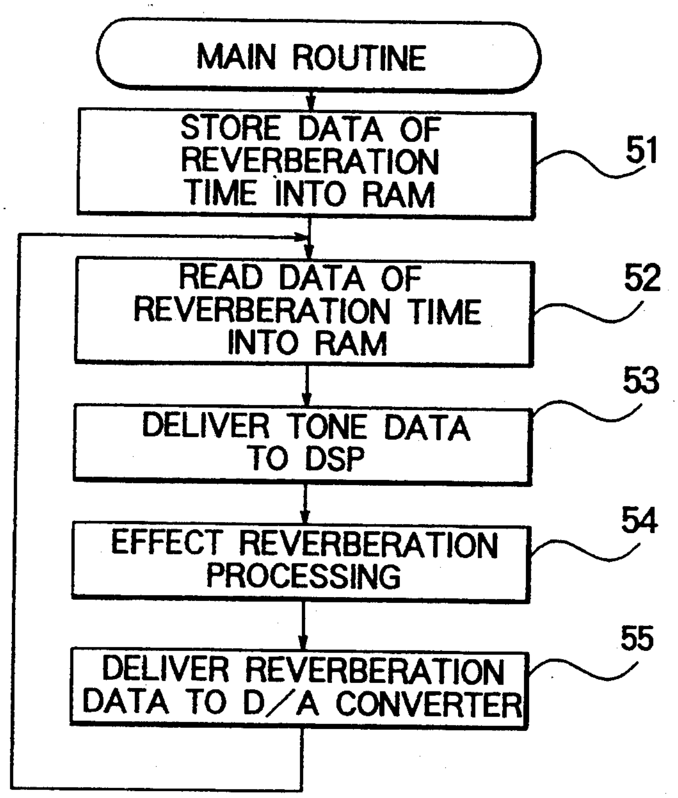
FIG. 7 is a flowchart of a main routine for controlling the operation of the sound effect-creating device according to the second embodiment.

Next, a main routine carried out by the sound effect-creating device 1 of the second embodiment will be described with reference to FIG. 7. The CPU reads data of initial settings to the device 1 stored in the RAM 17 when the power switch 6 is turned on, and indicates them on the display 2. When the switch 23 or 24 is depressed for setting a desired reverberation time, the CPU 11 receives data on the ON/OFF state of the switch 23 or 24 via the switch interface 14, and sets and indicates the basic reverberation time to a smaller or larger value in a manner proportional to duration of the ON state of the switch 23 or 24. Further, the tempo corresponding to the basic reverberation time is also determined and indicated on the display 2. In this connection, the correspondence between the basic reverberation time and the tempo is defined by the equation (1) used in the first embodiment:

$$\text{Basic reverberation time} = 5 - \text{tempo value}/50 \text{ (sec.)}$$

While the indications based the above settings are carried out, the CPU stores the data of the basic reverberation time, the tempo, and the reverberation time determined according to the meter of the musical tone, if required, into the RAM 17 at a step 51.

Figure 4:
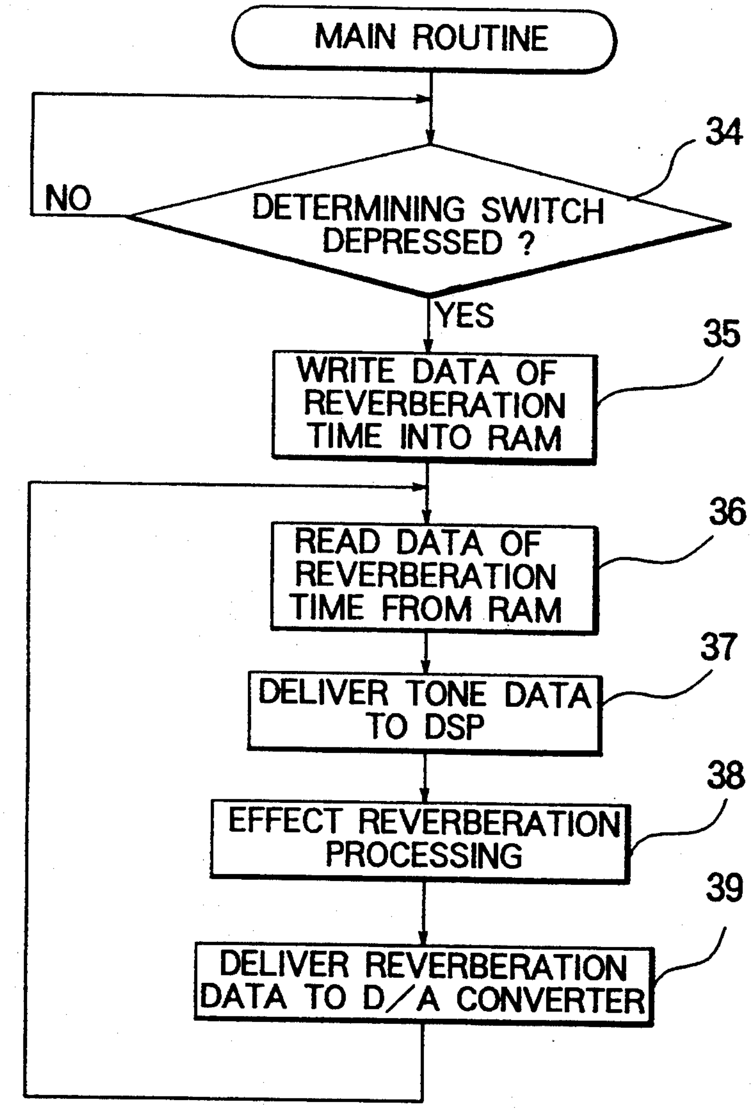
FIG. 4 is a flowchart of a main routine for controlling the operation of the sound effect-creating device according to the first embodiment.
Figure 5:
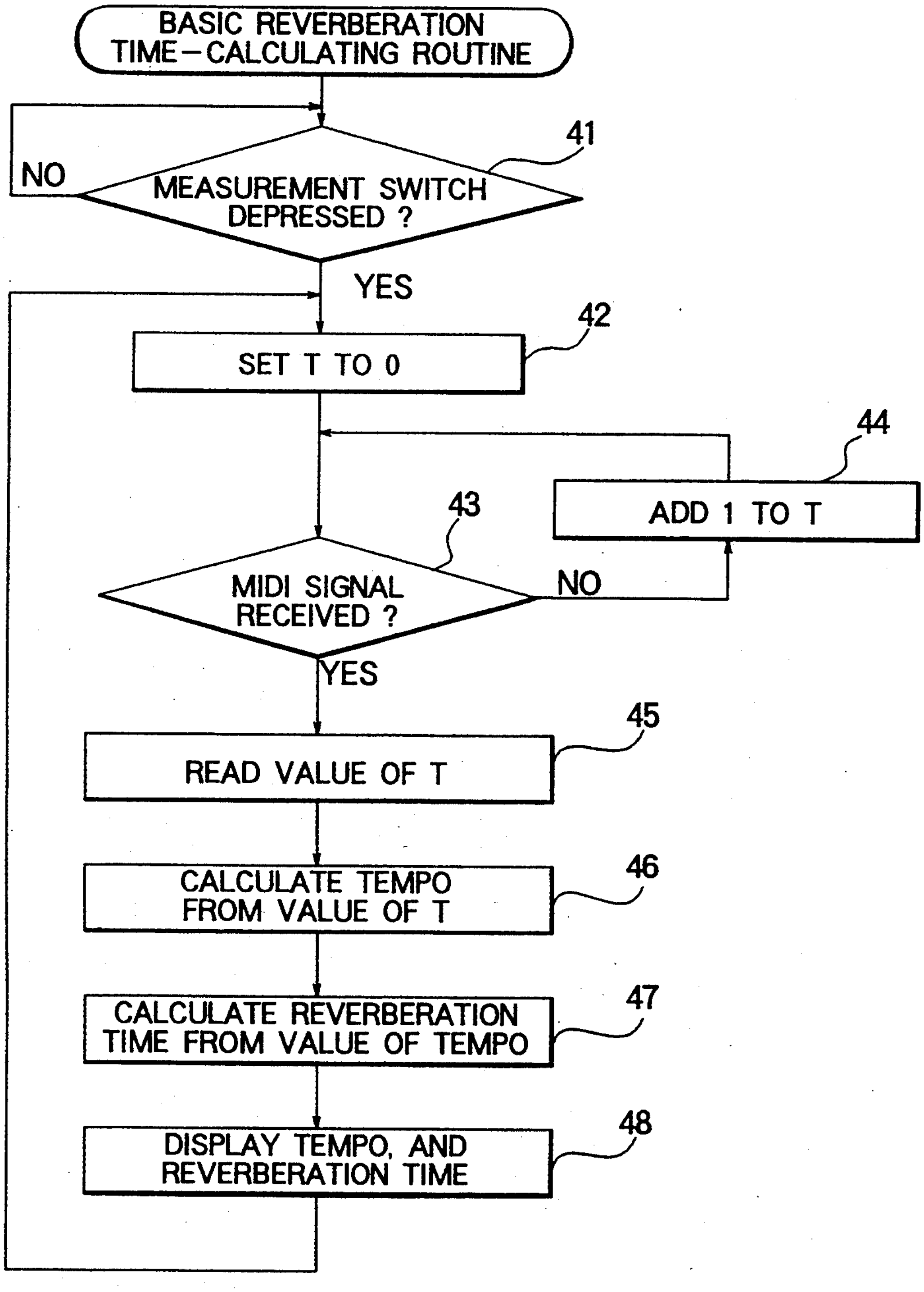
FIG. 5 is a flowchart of a basic reverberation time-calculating routine for calculating a basic reverberation time, which is executed by the sound effect-creating device according to the first embodiment.

The following steps 52 to 55 are identical to the steps 36 to 39 of the FIG. 4 main routine of the first embodiment, and description thereof is omitted.

Figure 8:
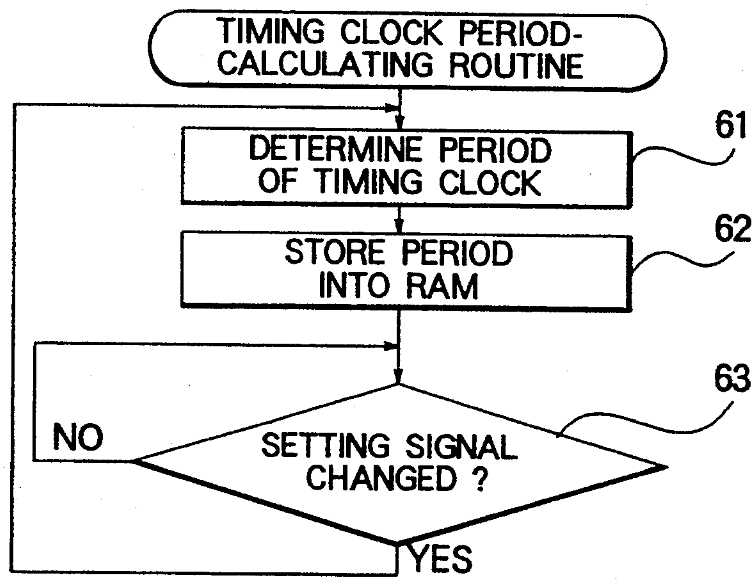
FIG. 8 is a flowchart of a timing clock period-calculating routine for calculating a period of a timing clock of a MIDI signal, which is executed by the sound effect-creating device according to the second embodiment.

Then, the calculation of the period of the timing clock of the MIDI signal will be described with reference to FIG. 8. First, the period of the timing clock is calculated at a step 61 from the basic reverberation time (or the tempo) set as described above.

Since twenty-four timing clocks are generated per one quarter note, and the tempo is the number of quarter notes counted per one minute, the period "p" of the timing clock is calculated by the use of the following equation (2):

$$p=1/(\text{tempo value}\div 60\times 24) \quad (2)$$

If the equation (1) is rearranged and tempo value thereof is substituted into the equation (2), there is obtained the following equation (3):

$$p=1/[(5-\text{basic reverberation time})\times 20] \quad (3)$$

For example, if the value of the basic reverberation time is equal to 2.6 (sec.) (in this case the tempo is set to 120, as defined by the equation (1)), the period of the timing clock is equal to 20.8 msec (frequency of same=48 Hz).

The results of calculation, i.e. the period of the timing clock is stored into the RAM 17 at a step 62. Then, the CPU 11 constantly checks for whether an ON/OFF signal from the switch 23 or 24 for setting the basic reverberation time is supplied via the switch interface 14 (step 63). When it is supplied, i.e., the basic reverberation time is changed, the program returns to the step 61.

Figure 9:
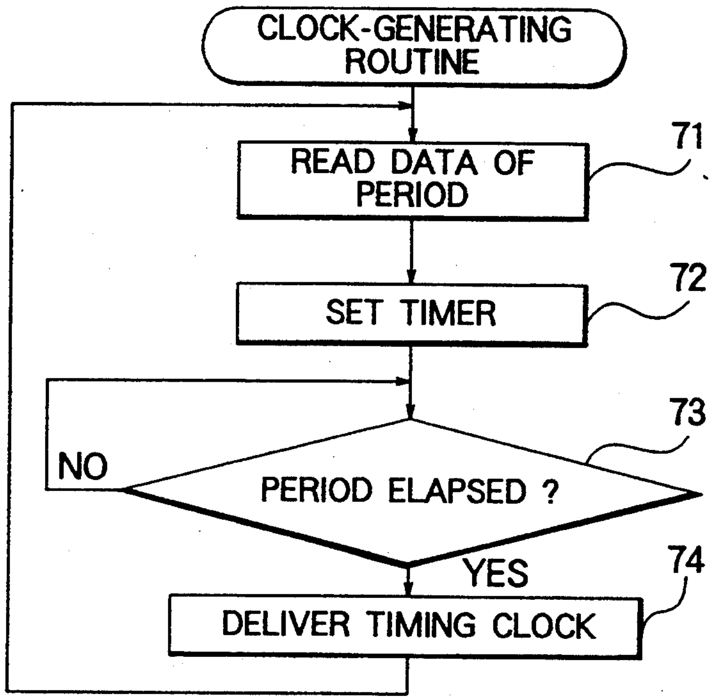
FIG. 9 is a flowchart of a clock generating routine for generating the timing clock of the MIDI signal, which is executed by the sound effect-creating device according to the second embodiment.

Next, a clock generating routine will be described with reference to FIG. 9. The CPU 11 reads data of the period of the timing clock from the RAM 17 at a step 71, and the period (one repetition period) is set to a timer, not shown, at a step 72. Then, the CPU 11 checks for the lapse of a time period equal to the period of the timing clock, whenever a predetermined very short time period elapses at a step 73. Each time the time period equal to the period of the timing clock elapses, the CPU 11 allows the timing clock (FSH) to be delivered from the MIDI block 18 to the electronic musical instrument at a step 74.

Figure 10:
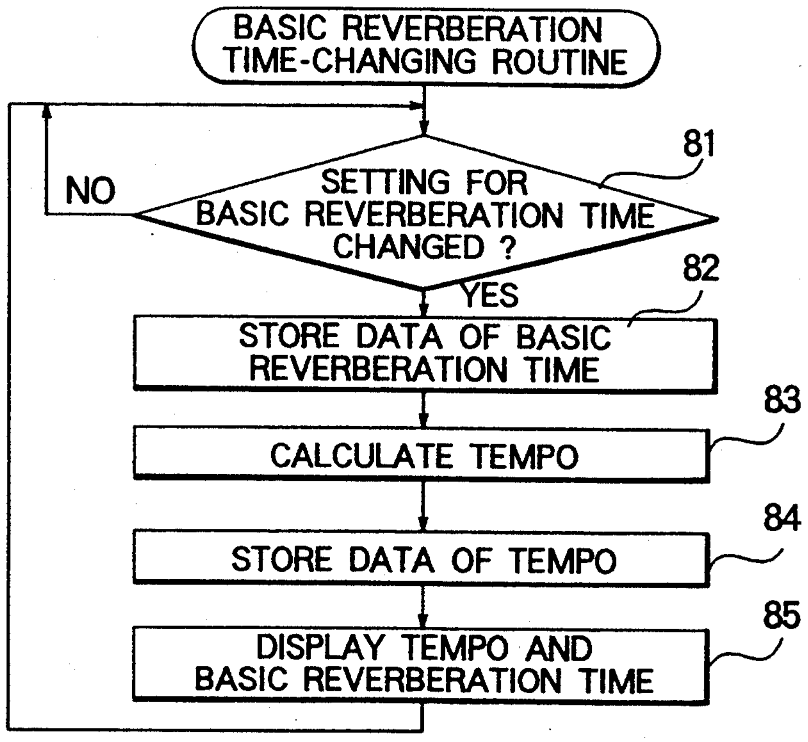
FIG. 10 is a flowchart of a basic reverberation time-changing routine for changing the basic reverberation time, which is executed by the sound effect-creating device according to the second embodiment.

Then, a basic reverberation time-changing routine will be described with reference to FIG. 10. According to this routine, the CPU 11 constantly checks for change of setting of the basic reverberation time at a step 81. If the basic reverberation time is changed, new data of the basic reverberation time is stored into the RAM 17 at a step 82. Next, the tempo of the music is calculated based on the data of the basic reverberation time according to the relationship defined in the equation (1) at a step 83. The data of the tempo is stored into the RAM 17 at a step 84.

The data of the tempo and the basic reverberation time determined as above are read from the RAM 17, and supplied via the display interface 15 to the display 2 to indicate them thereon at a step 85. Thereafter, the program returns to the step 81, for repeated execution of the basic reverberation time-changing routine.

Although, in the present embodiment, description is made mainly on the case where the reverberation time and the period of the timing clock of the MIDI signal are determined by setting the basic reverberation time, it goes without saying that similar results can be obtained by directly setting the tempo.

As described heretofore, according to the present embodiment, it is possible to reverberate the musical tone as desired by setting the basic reverberation time or the tempo, and further depending on the meter, if required, and at the same time allow the MIDI signal to be transmitted to the external electronic musical instrument at a frequency corresponding to the reverberation processing. Therefore, it is possible to cause the reverberation of the musical tone to be correlated with the tempo of performance of the electronic musical instrument for accompaniment, which results in an excellent reverberation effect imparted to the performance.

Further, it is to be understood that the present invention is not limited to the preferred embodiments described above. For example, various changes and modifications may be made to details of the routines carried out by the sound effect-creating device. Further, although in the second embodiment described above, the period of the timing clock is determined by calculation, this is not limitative but the period of the timing clock may be determined by retrieving a converting table for conversion from the basic reverberation time or tempo to the period of the timing clock.

Further, the number of the read addresses is not limited to the number mentioned in the embodiments, but it may be set to more than 10, or less than 10. Further, the data of the reverberation signal may be prepared by the method of fixing the locations of the read addresses, and changing the values of the coefficients in a manner corresponding to a desired reverberation time, to thereby perform reverberation processing of the musical tone signal over the desired reverberation time. The method may be modified or varied so long as it falls within the scope of the invention defined by the appended claims. Further, values of the coefficients may be set such that the amplitude of reverberations forms a simple attenuation curve, or alternatively such that it forms a complicated attenuation curve to give diversified variation in the volume of reverberations of the musical tone.

Further, if the tempo of the music is to be changed during the performance, data may be stored in the RAM in advance for automatically changing the tempo.

What is claimed is:

1. A sound effect-creating device for imparting a sound effect to a musical tone produced by performance, including reverberation means for subjecting an analog or digital signal indicative of said musical tone to reverberation processing over a predetermined reverberation time to thereby impart a reverberation effect to said musical tone, said sound effect-creating device comprising:

MIDI signal-receiving means connected to an electronic musical instrument for receiving a MIDI signal therefrom;

clock period-calculating means for calculating a period of a timing clock of said MIDI signal received by said MIDI signal-receiving means; and reverberation time-setting means for setting said predetermined reverberation time based on said period of said timing clock of said MIDI signal calculated by said clock period-calculating means.

2. A sound effect-creating device according to claim 1, wherein said reverberation time-setting means includes basic reverberation time-calculating means for calculating a basic reverberation time corresponding to a particular note based on said period of said timing clock of said MIDI signal calculated by said clock period-calculating means, and sets said predetermined reverberation time based on said basic reverberation time calculated by said basic reverberation time-calculating means.

3. A sound effect-creating device according to claim 2, wherein said reverberation time-setting means includes tempo determining means for determining a tempo of performance of said electronic musical instrument based on said period of said timing clock of said MIDI signal calculated by said clock period-calculating means, and said basic reverberation time-setting means sets said basic reverberation time based on said tempo determined by said tempo determining means.

4. A sound effect-creating device according to claim 2, wherein said reverberation time-setting means includes meter setting means for setting a parameter indicative of a meter of said musical tone, and sets said predetermined reverberation time based on said basic reverberation time depending on said parameter indicative of said meter of said musical tone.

5. A sound effect-creating device according to claim 3, wherein said reverberation time-setting means includes meter setting means for setting a parameter indicative of a meter of said musical tone, and sets said predetermined reverberation time based on said basic reverberation time depending on said parameter indicative of said meter of said musical tone.

6. A sound effect-creating device for imparting a sound effect to a musical tone produced by performance, including reverberation means for subjecting an analog or digital signal indicative of said musical tone to reverberation processing over a predetermined reverberation time to thereby impart a reverberation effect to said musical tone, said sound effect-creating device comprising:

reverberation time parameter-setting means for setting a reverberation time parameter for use in setting said predetermined reverberation time;

MIDI signal-delivering means for delivering a MIDI signal for control of an electronic musical instrument; and timing setting means for setting a period of a timing clock of said MIDI signal based on said reverberation time parameter set by said reverberation time parameter-setting means.

7. A sound effect-creating device according to claim 6, wherein said reverberation time parameter-setting means includes basic reverberation time-setting means for setting, as said reverberation time parameter, a basic reverberation time corresponding to a particular note for use in setting said predetermined reverberation time, and said timing setting means sets said period of said timing clock of said MIDI signal based on said basic reverberation time set by said basic reverberation time-setting means.

8. A sound effect-creating device according to claim 6, wherein said reverberation time parameter-setting means includes tempo setting means for setting, as said reverberation time parameter, a tempo of performance of said musical tone, said tempo being in a predetermined relationship with a basic reverberation time corresponding to a particular note for use in setting said predetermined reverberation time, and said timing setting means sets said period of said timing clock of said MIDI signal based on said tempo set by said tempo setting means.

9. A sound effect-creating device according to claim 7, including meter-setting means for setting a parameter indicative of a meter of said musical tone, and reverberation time-setting means for setting said predetermined reverberation time based on said basic reverberation time depending on said parameter indicative of said meter of said musical tone.

10. A sound effect-creating device according to claim 8, including meter-setting means for setting a parameter indicative of a meter of said musical tone, and reverberation time-setting means for setting said predetermined reverberation time based on said basic reverberation time depending on said parameter indicative of said meter of said musical tone.

* * * * *